(12) United States Patent
Wu et al.

(10) Patent No.: US 11,109,481 B2
(45) Date of Patent: Aug. 31, 2021

(54) METHOD FOR MANUFACTURING PRINTED WIRING BOARD AND PRINTED WIRING BOARD

(71) Applicant: IBIDEN CO., LTD., Ogaki (JP)

(72) Inventors: Youhong Wu, Ogaki (JP); Koji Sato, Ogaki (JP); Yoshihiro Kodera, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/791,277

(22) Filed: Feb. 14, 2020

(65) Prior Publication Data
US 2020/0266075 A1 Aug. 20, 2020

(30) Foreign Application Priority Data

Feb. 15, 2019 (JP) .............................. JP2019-025280
Apr. 15, 2019 (JP) .............................. JP2019-077063

(51) Int. Cl.
*H05K 1/11* (2006.01)

(52) U.S. Cl.
CPC ...... *H05K 1/111* (2013.01); *H05K 2201/0367* (2013.01); *H05K 2201/094* (2013.01); *H05K 2201/0939* (2013.01); *H05K 2201/09409* (2013.01); *H05K 2201/09472* (2013.01); *H05K 2201/09745* (2013.01)

(58) Field of Classification Search
CPC ...... H05K 1/0298; H05K 3/24; H05K 3/3457; H05K 3/4007; H05K 3/4644; H05K 2201/094; H05K 2201/0391; H01L 24/11; H01L 24/14; H01L 24/17; H01L 2224/1703
See application file for complete search history.

(56) References Cited

U.S. PATENT DOCUMENTS

| 2008/0264681 | A1* | 10/2008 | Iwai | ................... H01L 21/4853 174/257 |
| 2010/0263923 | A1* | 10/2010 | Kodani | ............... H01L 21/4853 174/260 |
| 2015/0267310 | A1* | 9/2015 | Ikumoto | .................. C25D 3/32 205/125 |
| 2016/0100484 | A1* | 4/2016 | Kunieda | .............. H05K 3/4007 174/257 |

FOREIGN PATENT DOCUMENTS

JP 2010-129996 A 6/2010

* cited by examiner

*Primary Examiner* — Steven T Sawyer
*Assistant Examiner* — Paresh H Paghadal
(74) *Attorney, Agent, or Firm* — Oblon, McClelland, Maier & Neustadt, L.L.P.

(57) ABSTRACT

A method for manufacturing a printed wiring board includes forming a base insulating layer, forming a conductor layer on the base layer, forming a solder resist layer on the base layer such that the resist layer covers the conductor layer, forming first opening exposing a first pad of the conductor layer, forming second opening exposing a second pad of the conductor layer and having diameter smaller than diameter of the first opening, forming a first bump on the first pad, and forming a second bump on the second pad such that the second bump has diameter smaller than diameter of the first bump. The first bump includes a first base plating layer and a first top plating layer, and the second bump includes a second base plating layer and a second top plating layer having upper surface higher than the uppermost position of upper surface of the first top layer.

20 Claims, 8 Drawing Sheets

Before Reflow

After Reflow

METHOD FOR MANUFACTURING PRINTED WIRING BOARD AND PRINTED WIRING BOARD

CROSS-REFERENCE TO RELATED APPLICATIONS

The present application is based upon and claims the benefit of priority to Japanese Patent Applications No. 2019-025280, filed Feb. 15, 2019, and No. 2019-077063, filed Apr. 15, 2019, the entire contents of which are incorporated herein by reference.

BACKGROUND OF THE INVENTION

Field of the Invention

The present invention relates to a method for manufacturing a printed wiring board having plating bumps, and relates to the printed wiring board.

Description of Background Art

Japanese Patent Application Laid-Open Publication No. 2010-129996 describes bump formation using a plating method. The entire contents of this publication are incorporated herein by reference.

SUMMARY OF THE INVENTION

According to one aspect of the present invention, a method for manufacturing a printed wiring board includes forming a base insulating layer, forming a conductor layer on the base insulating layer, forming a solder resist layer on the base insulating layer such that the solder resist layer covers the conductor layer, forming a first opening in the solder resist layer such that the first opening exposes a first conductor pad of the conductor layer, forming a second opening in the solder resist layer such that the second opening exposes a second conductor pad of the conductor layer and has a diameter smaller than a diameter of the first opening, forming a first bump on the first conductor pad, and forming a second bump on the second conductor pad such that the second bump has a diameter smaller than a diameter of the first bump. The forming of the first bump includes forming a first base plating layer in the first opening, forming a first top plating layer on the first base plating layer, and reflowing the first top plating layer, and the forming of the second bump includes forming a second base plating layer in the second opening, forming a second top plating layer on the second base plating layer such that the second top plating layer has an upper surface that is higher than the uppermost position of an upper surface of the first top plating layer, and reflowing the second top plating layer.

According to another aspect of the present invention, a printed wiring board includes a base insulating layer, a conductor layer formed on the base insulating layer, a solder resist layer formed on the base insulating layer and covering the conductor layer such that the solder resist layer has a first opening exposing a first conductor pad of the conductor layer and a second opening exposing a second conductor pad of the conductor layer and having a diameter smaller than a diameter of the first opening, a first bump formed on the first conductor pad and including a first base plating layer formed in the first opening, and a first top plating layer formed on the first base plating layer, and a second bump formed on the second conductor pad and including a second base plating layer formed in the second opening, and a second top plating layer formed on the second base plating layer such that the second bump has a diameter smaller than a diameter of the first bump. The first bump and the second bump are formed such that the lowermost position of the first top plating layer of the first bump is lower than the lowermost position of the second top plating layer of the second bump and that the uppermost position of the first top plating layer of the first bump is substantially the same as the uppermost position of the second top plating layer of the second bump.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
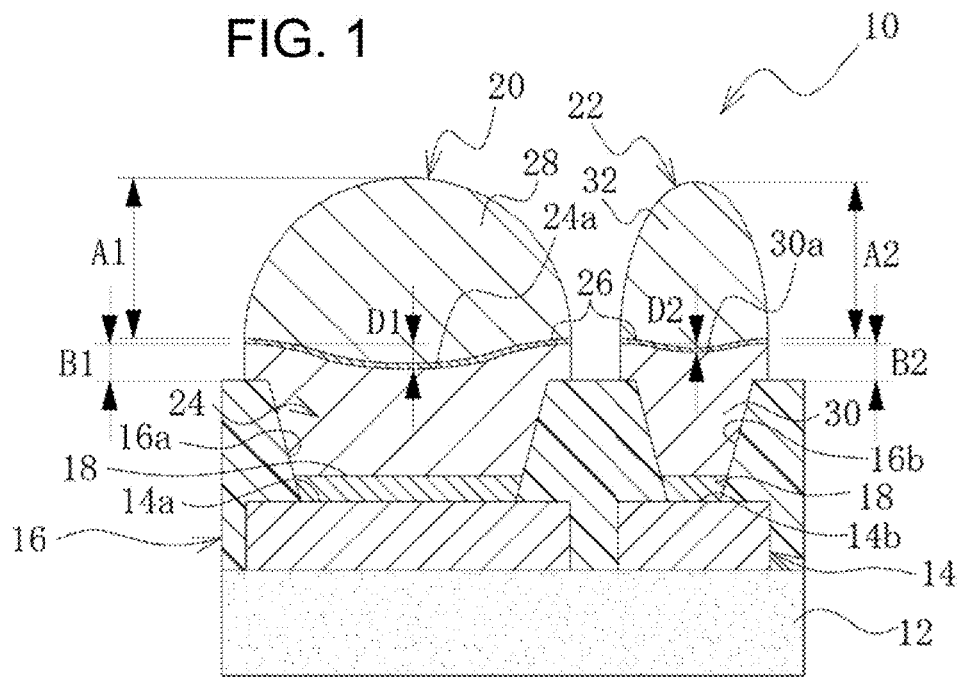
FIG. 1 is a cross-sectional view illustrating a printed wiring board manufactured using a manufacturing method of an embodiment of the present invention.

Embodiments will now be described with reference to the accompanying drawings, wherein like reference numerals designate corresponding or identical elements throughout the various drawings.

A method for manufacturing a printed wiring board according to an embodiment of the present invention is described with reference to the drawings. FIG. 1 is an enlarged view of a portion of a printed wiring board 10 manufactured using the manufacturing method of the embodiment. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, instead of a core substrate, the printed wiring board 10 may be a coreless substrate obtained by alternately laminating conductor layers and resin insulating layers on a support plate (not illustrated in the drawings) and then removing the support plate. In any case, as illustrated in FIG. 1, the printed wiring board 10 includes at least a base insulating layer 12 which is an outermost resin insulating layer, a conductor layer 14 which is formed on the base insulating layer 12 and has a predetermined circuit pattern, and a solder resist layer 16 which is formed on the base insulating layer 12 and the conductor layer 14. Other multiple conductor layers and multiple resin insulating layers are often alternately formed below the base insulating layer 12, but are omitted in the drawings. However, it is also possible that the printed wiring board 10 is formed from one insulating layer (the base insulating layer 12) and one conductor layer (the conductor layer 14).

The base insulating layer 12 can be formed of, for example, a resin composition or the like containing an inorganic filler such as silica or alumina and an epoxy resin. The conductor layer 14 is formed of a conductive metal, for example, a metal containing copper as a main component.

The solder resist layer 16 has a first opening (16a) exposing a portion of the conductor layer 14 as a first conductor pad (14a) and a second opening (16b) having a smaller diameter than the first opening (16a) and exposing another portion of the conductor layer 14 as a second conductor pad (14b). An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

An underlayer 18 may be formed on each of the first and second conductor pads (14a, 14b). As the underlayer 18, a nickel layer formed on a surface of each of the first and second conductor pads (14a, 14b), a palladium layer formed on the nickel layer, and a gold layer formed on the palladium layer can be exemplified. In addition, a nickel layer and a gold layer formed on the nickel layer can be exemplified. It is also possible that the underlayer 18 is not formed.

The printed wiring board 10 further includes a first bump 20 which is formed on the first conductor pad (14a) via the underlayer 18, and a second bump 22 which is formed on the second conductor pad (14b) via the underlayer 18 and has a smaller diameter than the first bump 20. In the case where the underlayer 18 is not formed, the first and second bumps (20, 22) can be respectively formed directly on the first and second conductor pads (14a, 14b). The first bump 20 can be used for connecting to a power source or a ground line. The second bump 22 having a smaller diameter than the first bump 20 can be used for connecting to a signal line.

The first bump 20 has a first base plating layer 24 formed in the first opening (16a), and a first top plating layer 28 formed on the first base plating layer 24 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the first top plating layer 28 can be formed directly on the first base plating layer 24.

The first base plating layer 24 is formed of a conductive metal, preferably a metal containing copper as a main component. The first base plating layer 24 is preferably formed to a height exceeding a surface of the solder resist layer 16 (a surface on an opposite side with respect to the base insulating layer 12). As a result, the first bump 20 is stably held in the first opening (16a). A thickness (B1) of the first base plating layer 24 measured from the surface of the solder resist layer 16 is preferably within a range of 3 μm-20 μm. The first base plating layer 24 has a first recess (24a) in an upper central portion thereof. That is, the upper central portion of the first base plating layer 24 is formed at a position lower than an upper outer peripheral portion thereof. A depth (D1) of the first recess (24a), that is, a distance from a highest position of the upper outer peripheral portion of the first base plating layer 24 to a bottom position of the recess is 20 μm or less. By reducing the depth (D1) of the first recess (24a), in some cases, when the first top plating layer 28 is formed on the first base plating layer 24 via the intermediate layer 26, gas accumulation in the first recess (24a) is suppressed. As a result, occurrence of voids in the first top plating layer 28 is reduced. The depth (D1) of the first recess (24a) is preferably 15 μm or less, and more preferably 10 μm or less.

The first top plating layer 28 is formed of a metal which has a melting point lower than that of the first base plating layer 24 and which is melted by a reflow treatment and is shaped into a substantially hemispherical shape as illustrated in FIG. 1, for example, a metal containing tin as a main component. A thickness (A1) of the first top plating layer 28 (a distance in a vertical direction from a lower end of the first top plating layer 28 to a top of the first top plating layer on an outer peripheral surface of the first bump 20) is preferably set in a range of 5 μm-45 μm. By setting the thickness (A1) of the first top plating layer 28 in this range, good connection reliability can be obtained between the first bump 20 and a connection pad (not illustrated in the drawings) of an electronic component such as a semiconductor chip or a memory mounted on the printed wiring board 10.

The second bump 22 has a second base plating layer 30 formed in the second opening (16b), and a second top plating layer 32 formed on the second base plating layer 30 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the second top plating layer 32 can be formed directly on the second base plating layer 30.

The second base plating layer 30 is formed of a conductive metal, preferably a metal containing copper as a main component. The second base plating layer 30 is preferably formed to a height exceeding the surface of the solder resist layer 16 (the surface on an opposite side with respect to the base insulating layer 12). As a result, the second bump 22 is stably held in the second opening (16b). A thickness (B2) of the second base plating layer 30 measured from the surface of the solder resist layer 16 is preferably within a range of 3 μm-20 μm. The second base plating layer 30 has a second recess (30a) in an upper central portion thereof. That is, the upper central portion of the second base plating layer 30 is formed at a position lower than an upper outer peripheral portion thereof. A depth (D2) of the second recess (30a), that is, a distance from a highest position of the upper outer peripheral portion of the second base plating layer 30 to a bottom position of the second recess (30a) is smaller than the depth (D1) of the first recess (24a). In the second bump 22 having a smaller diameter than the first bump 20, by making the depth (D2) of the second recess (30a) smaller than the depth (D1) of the first recess (24a), in some cases, when the second top plating layer 32 is formed on the second base plating layer 30 via the intermediate layer 26, gas accumulation in the second recess (30a) can be suppressed. As a result, occurrence of voids in the second top plating layer 32 is reduced.

The second top plating layer 32 is formed of a metal which has a melting point lower than that of the second base plating layer 30 and which is melted by a reflow treatment and is shaped into a substantially hemispherical shape as illustrated in FIG. 1, for example, a metal containing tin as a main component. A thickness (A2) of the second top plating layer 32 (a distance in the vertical direction from a lower end of the second top plating layer 32 to a top of the second top plating layer 32 on an outer peripheral surface of the second bump 22) is preferably set in a range of 5 μm-45 μm. By setting the thickness (A2) of the second top plating layer 32 in this range, good connection reliability can be obtained between the second bump 22 and a connection pad (not illustrated in the drawings) of an electronic component such as a semiconductor chip or a memory mounted on the printed wiring board 10.

In a printed wiring board according to an embodiment of the present invention, a lowermost position of the first bump 20 is lower than a lowermost position of the second bump 22, and an upper most position of the first bump 20 is substantially the same as an uppermost position of the second bump 22.

Figure 2:
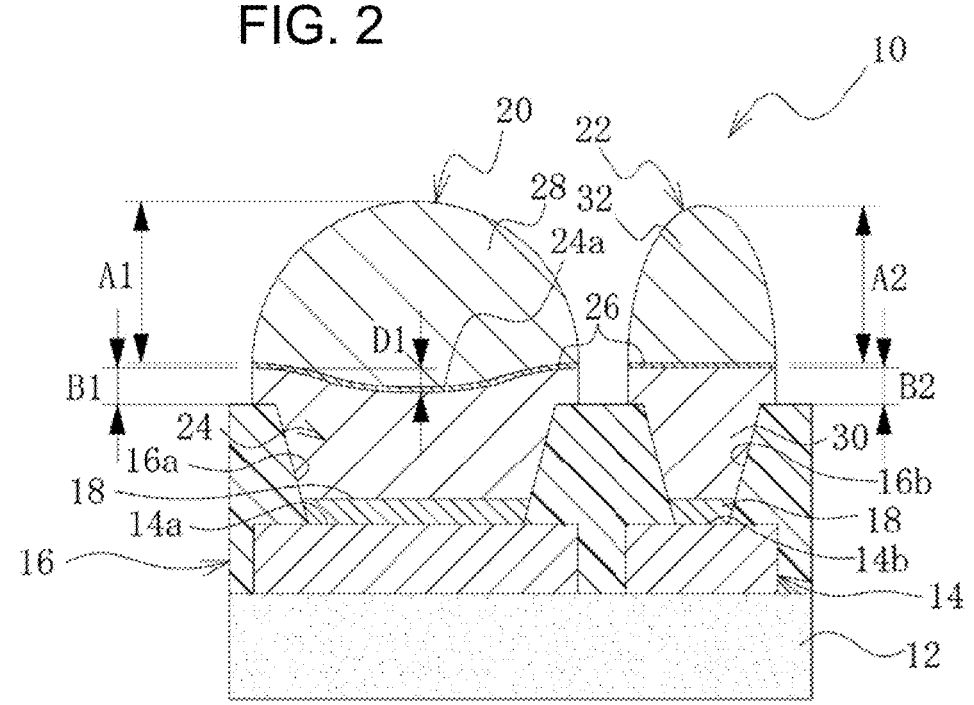
FIG. 2 is a cross-sectional view illustrating a modified embodiment of a printed wiring board manufactured using the manufacturing method of the embodiment of the present invention.

FIG. 2 illustrates a modified embodiment of the printed wiring board 10 illustrated in FIG. 1. An element or a portion that is the same as an element or a portion described with reference to FIG. 1 is denoted using the same reference numeral symbol, and detailed description thereof is omitted as appropriate. In the printed wiring board 10 according to this modified embodiment, the upper surface of the second base plating layer 30 of the second bump 22 is formed flat. Other structures thereof are the same as those of the printed wiring board 10 of FIG. 1. The term "flat" means that the upper surface of the second base plating layer 30 is substantially parallel to a main surface of the printed wiring board 10, and micro irregularities that can be generated by a plating treatment may be present. By flattening the upper surface of the second base plating layer 30, a void occurrence rate in the second bump 22 is reduced as compared to the second bump 22 illustrated in FIG. 1 which has the second recess (30a) in the upper central portion thereof.

Figure 3:
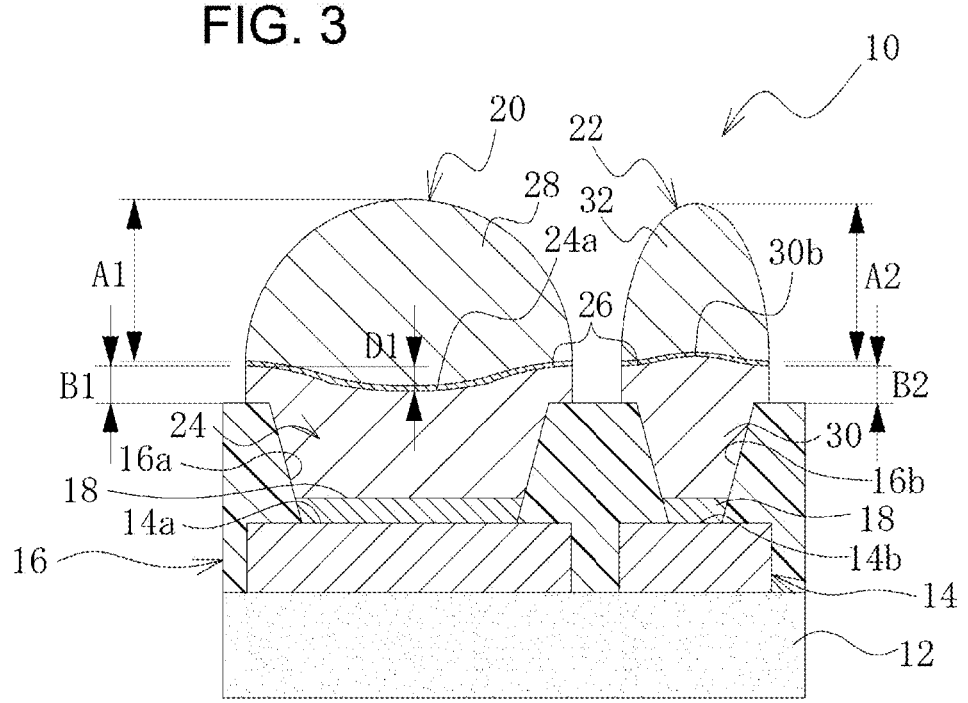
FIG. 3 is a cross-sectional view illustrating a modified embodiment of a printed wiring board manufactured using the manufacturing method of the embodiment of the present invention.

FIG. 3 illustrates a modified embodiment of the printed wiring board 10 illustrated in FIG. 1. An element or a portion that is the same as an element or a portion described with reference to FIG. 1 is denoted using the same reference numeral symbol, and detailed description thereof is omitted as appropriate. In the printed wiring board 10 according to this modified embodiment, a raised portion (30b) is formed in the upper central portion of the second base plating layer 30 of the second bump 22. That is, the upper central portion of the second base plating layer 30 is at a position higher than the upper outer peripheral portion thereof. Other structures thereof are the same as those of the printed wiring board 10 of FIG. 1. By forming the raised portion (30b) in the upper central portion of the second base plating layer 30 the void occurrence rate in the second bump 22 is reduced as compared to the second bump 22 illustrated in FIG. 1 or FIG. 2 having the second recess (30a) in the upper central portion or having a flat upper surface.

Method for Manufacturing a Printed Wiring Board

In the following, a method for manufacturing the printed wiring board 10 illustrated in FIG. 1 according to an embodiment of the present invention is described with reference to FIGS. 4A-4H. The printed wiring boards 10 of the modified embodiments illustrated in FIGS. 2-3 are also manufactured using the same manufacturing method.

Figure 4A:
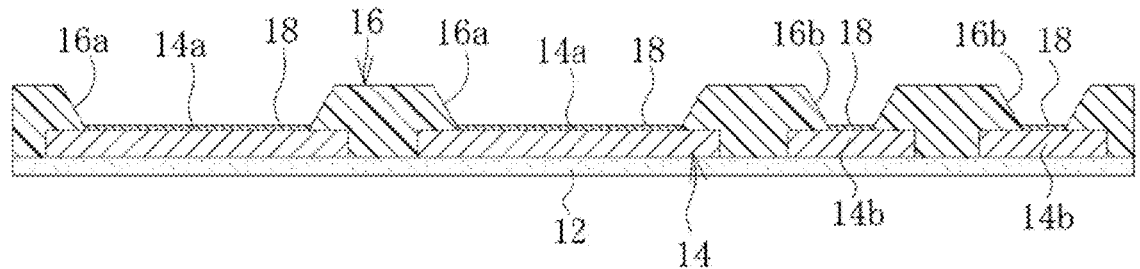
FIG. 4A is a cross-sectional view illustrating a method for manufacturing a printed wiring board according to an embodiment of the present invention.

FIG. 4A illustrates an intermediate in which the conductor layer 14 and the solder resist layer 16 are formed on the base insulating layer 12, the conductor layer 14 having a predetermined circuit pattern. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12. For the base insulating layer 12, an insulating resin film for a build-up layer containing inorganic filler such as silica or alumina and an epoxy resin can be used. In the solder resist layer 16, for example, using carbon dioxide gas laser or UV-YAG laser or the like, the first opening (16a) exposing a portion of the conductor layer 14 as the first conductor pad (14a) and the second opening (16b) exposing another portion of the conductor layer 14 as the second conductor pad (14b) are formed. The first opening (16a) preferably has an aspect ratio or 0.5 or less and the second opening (16b) preferably has an aspect ratio of 0.6 or more. On each of the first and second conductor pads (14a, 14b), an underlayer 18 is formed, for example, by laminating in this order a nickel layer, a palladium layer, and a gold layer by plating. It is also possible that the underlayer 18 is not formed.

Figure 4B:
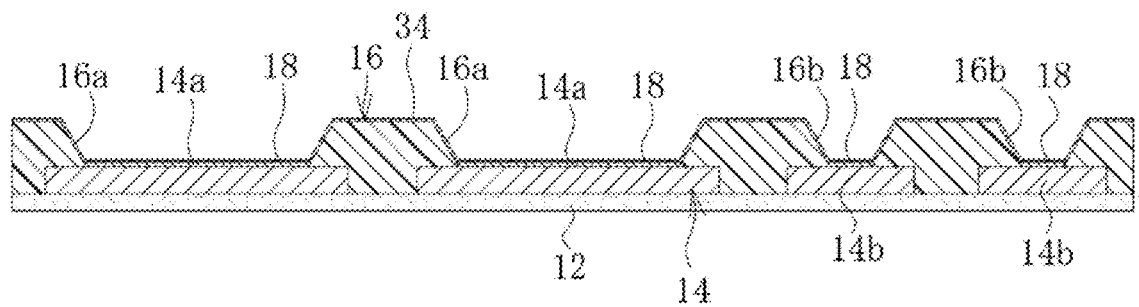
FIG. 4B is a cross-sectional view illustrating the method for manufacturing a printed wiring board according to the embodiment of the present invention.

As illustrated in FIG. 4B, for example, an electroless plating treatment such as an electroless copper plating treatment is performed, and a seed layer 34 is formed on a surface of the intermediate (the surface of the solder resist layer 16 and side surfaces of the first and second openings (16a, 16b)) and on surfaces of the underlayers 18 (in the case where the underlayers 18 are not formed, on the conductor pads (14a, 14b)).

Figure 4C:
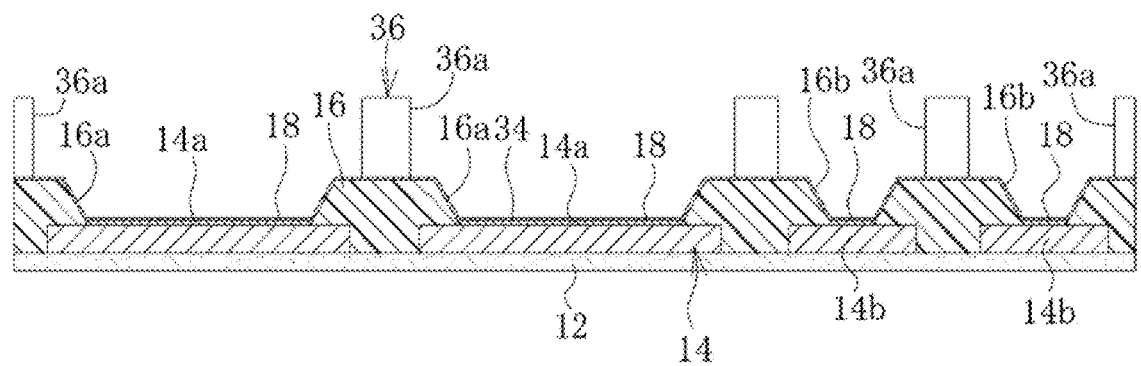
FIG. 4C is a cross-sectional view illustrating the method for manufacturing a printed wiring board according to the embodiment of the present invention.

As illustrated in FIG. 4C, on the seed layer 34, a plating resist 36 of a predetermined pattern having openings (36a) at planed formation positions of the first and second bumps (20, 22) (FIG. 1) is formed.

Figure 4D:
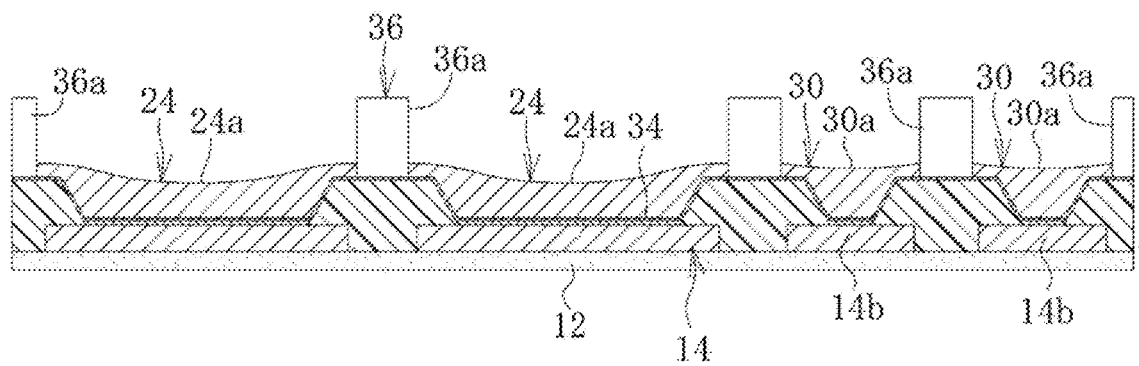
FIG. 4D is a cross-sectional view illustrating the method for manufacturing a printed wiring board according to the embodiment of the present invention.

As illustrated in FIG. 4D, an electrolytic plating treatment is performed, and, on portions of the seed layer 34 exposed from the plating resist 36, the first base plating layer 24 and the second base plating layer 30, which each contain, for example, copper as a main component, are formed. In this case, when the printed wiring boards 10 illustrated in FIGS. 1-3 are manufactured, a plating thickness of the first base plating layer 24 is adjusted such that the first recess (24a) having a depth of 20 μm or less, preferably 15 μm or less, more preferably 10 μm or less is formed in the upper central portion thereof. When the printed wiring board 10 illustrated in FIG. 2 is manufactured, the thickness of the second base plating layer 30 is adjusted such that the upper surface of the second base plating layer 30 is flat. When the printed wiring board 10 illustrated in FIG. 3 is manufactured, the plating thickness of the second base plating layer 30 is adjusted such that the raised portion (30b) is formed in the upper central portion of the second base plating layer 30.

Further, when the first and second base plating layers (24, 30) are formed, the plating thicknesses of the first and second base plating layers (24, 30) are preferably adjusted such that the thickness of the first base plating layer 24 and the thickness of the second base plating layer 30, measured from the surface of the solder resist layer 16, are each within a range of 3 μm-20 μm.

Figure 4E:
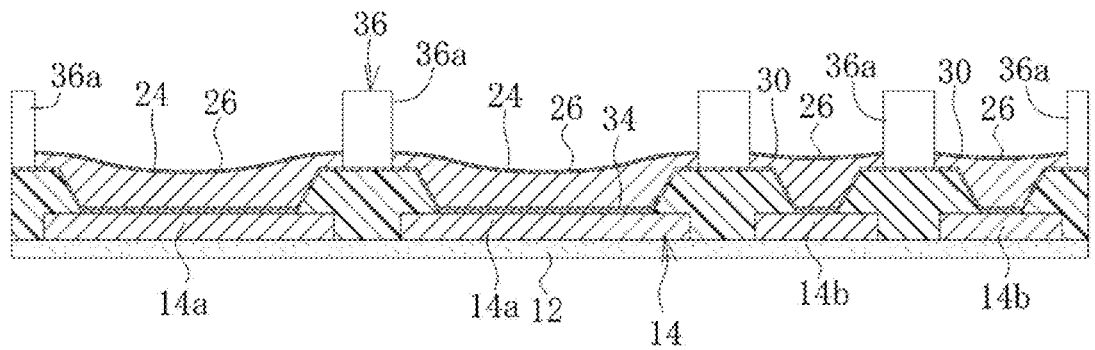
FIG. 4E is a cross-sectional view illustrating the method for manufacturing a printed wiring board according to the embodiment of the present invention.

As illustrated in FIG. 4E, for example, an electrolytic plating treatment is performed, and the intermediate layer 26 containing, for example, nickel as a main component is formed on the first and second base plating layers (24, 30). The intermediate layer 26 preferably has a thickness of 7 μm or less. It is also possible that the intermediate layer 26 is not formed.

Figure 4F:
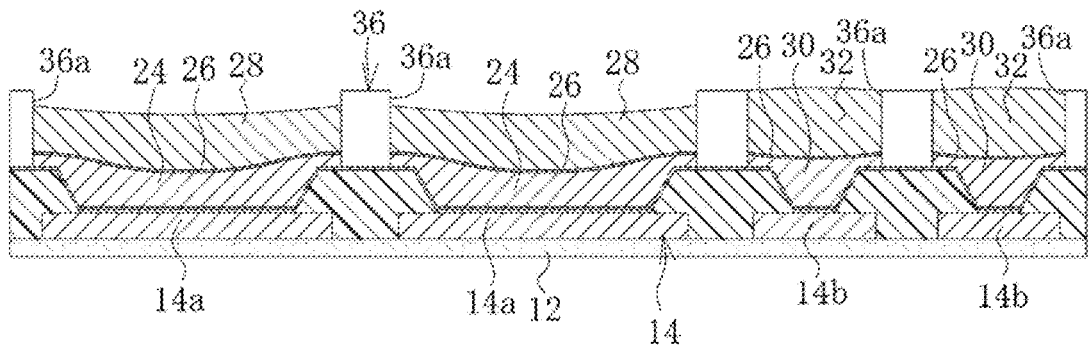
FIG. 4F is a cross-sectional view illustrating the method for manufacturing a printed wiring board according to the embodiment of the present invention.

As illustrated in FIG. 4F, an electrolytic plating treatment is performed, and the first and second top plating layers (28, 32) are respectively formed on the first and second base plating layers (24, 30) via the intermediate layers 26. The first and second top plating layers (28, 32) are each formed of a metal which has a melting point lower than that of the first and second base plating layers (24, 30) and which is melted by a reflow treatment and is shaped into a substantially hemispherical shape, for example, a metal containing tin as a main component. The first and second top plating layers (28, 32) preferably each have a thickness in a range of 5-45 μm. By flattening the upper surface of the first base plating layer 24 or by forming the first recess (24a) having the depth (D1) of 20 μm or less in the upper central portion thereof, when the first top plating layer 28 is formed, gas accumulation in the first recess (24a) is suppressed. As a result, occurrence of voids in the first top plating layer 28 is reduced. Further, by flattening the upper surface of the second base plating layer 30 or by forming the second recess (30a) shallower than the first recess (24a) in the upper central portion thereof, or by forming the raised portion (30b) in the upper central portion thereof, when the second top plating layer 32 is formed, gas accumulation near the second base plating layer 30 is suppressed. As a result, occurrence of voids in the second top plating layer 32 is reduced.

A feature according to an embodiment of the present invention is that, in the process illustrated in FIG. 4F, the uppermost position of the upper surface of the second top plating layer 32 is above the uppermost position of the upper surface of the first top plating layer 28. In this way, by forming the second top plating layer 32 having the upper surface above the uppermost position of the upper surface of the first top plating layer 28, when the first top plating layer 28 and the second top plating layer 32 are reflowed in the next process, as illustrated in FIG. 4H, the uppermost position of the upper surface of the first top plating layer 32 and the uppermost position of the upper surface of the second top plating layer 32 after reflow are at the same height. As a result, the first bump 20 and the second bump 22 having the same bump height can be formed.

Figure 4G:
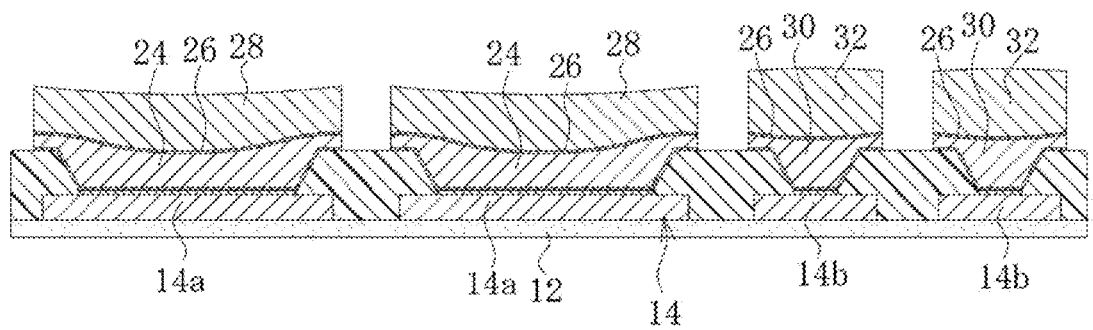
FIG. 4G is a cross-sectional view illustrating the method for manufacturing a printed wiring board according to the embodiment of the present invention.
Figure 4H:
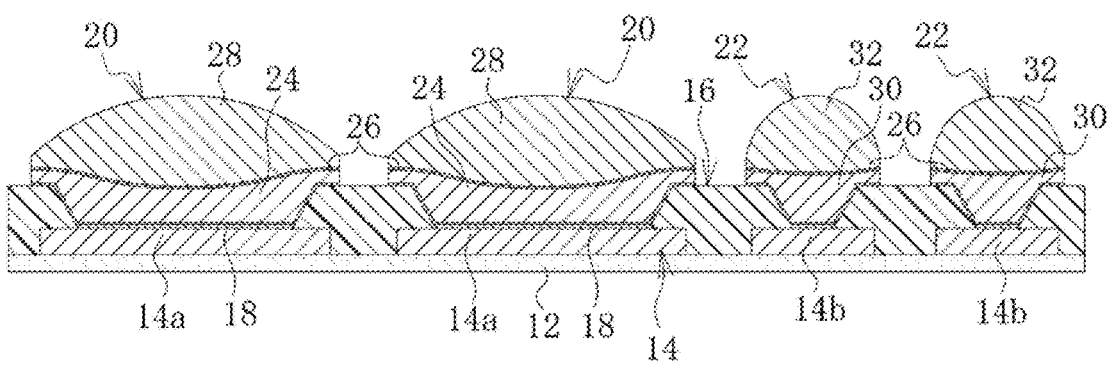
FIG. 4H is a cross-sectional view illustrating the method for manufacturing a printed wiring board according to the embodiment of the present invention.

As illustrated in FIG. 4G, the plating resist 36 is peeled off. Further, a portion of the seed layer 34 exposed by the removal of the plating resist 36 is removed by etching.

As illustrated in FIG. 4H, a reflow treatment is performed, and the first top plating layer 28 and the second top plating layer 32 are shaped into substantially hemispherical shapes. By the reflow treatment, in the case where the intermediate layer 26 is formed, the first bump 20 and the second bump 22 each including a copper layer, a copper/nickel alloy layer, a nickel layer, a nickel/tin alloy layer and a tin layer from a side close to the first and second conductor pads (14a, 14b) are formed. In the case where the intermediate layer 26 is not formed, the first bump 20 and the second bump 22 each including a copper layer, a copper/tin alloy layer, and a tin layer from a side close to the first and second conductor pads (14a, 14b) are formed.

Figure 5A:
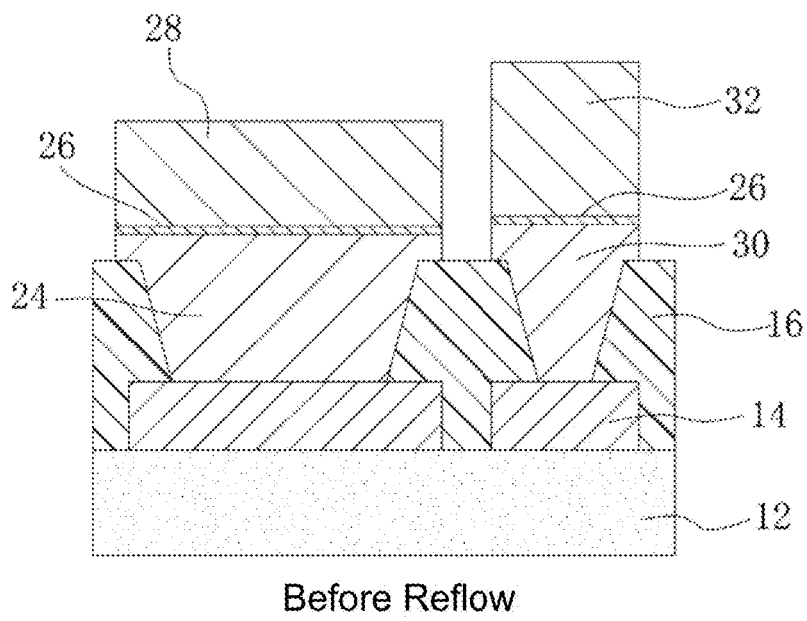
FIGS. 5A and 5B are cross-sectional views each illustrating a process including a feature of a method for manufacturing a printed wiring board according to an embodiment of the present invention.
Figure 5B:
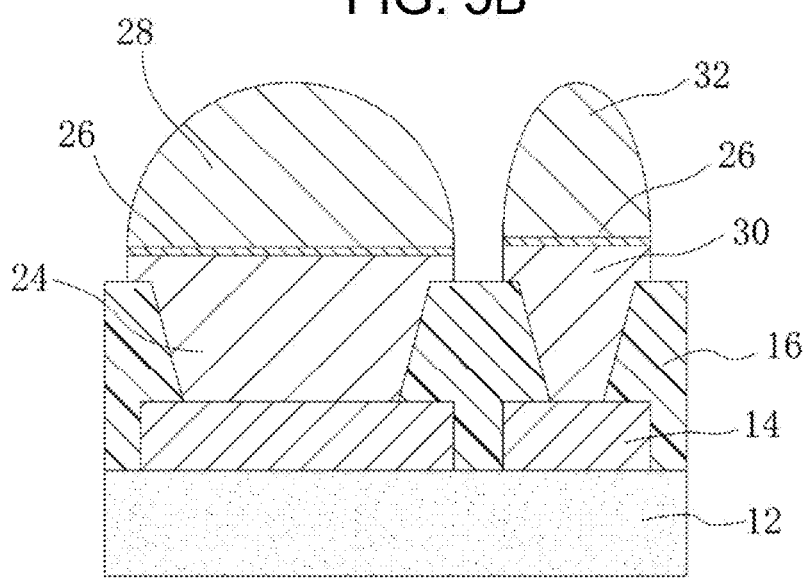

In an embodiment of the present invention, the following factors are thought to be factors contributing to control for forming the second top plating layer 32 having the upper surface above the uppermost position of the upper surface of the first top plating layer 28 and equalizing the bump heights after reflow. Main factors are thought to be the thicknesses of the first base plating layer 24 and the second base plating layer 30, the thickness of the intermediate layer 26, the bump diameters of the first bump 20 and the second bump 22, the thicknesses of the first top plating layer 28 and the second top plating layer 30 before reflow, and the depths of the first recess (24a) and the second recess (30a) before reflow. As an example, FIGS. 5A and 5B illustrate an example in which the thickness of the second base plating layer 30 is larger than the thickness of the first base plating layer 24 and the second top plating layer 32 having the upper surface above the uppermost position of the upper surface of the first top plating layer 28 is formed. When other factors are used for the control, similarly, by controlling the thicknesses, the diameters and the depths of the factors, an embodiment of the present invention can be achieved.

A manufacturing process of the embodiment illustrated in FIGS. 5A and 5B in which the thickness of the second base plating layer 30 is larger than the thickness of the first base plating layer 24 is described with reference to FIGS. 6A-6G and FIGS. 7A-7H. In the embodiments illustrated in FIGS. 6A-6G and FIGS. 7A-7H, an element or a portion that is the same as an element or a portion described with reference to the manufacturing process of FIG. 4A-FIG. 4H is denoted using the same reference numeral symbol and detailed description thereof is omitted as appropriate.

Figure 6A:
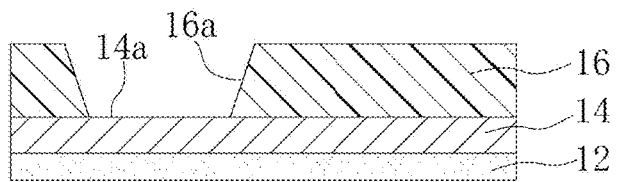
FIGS. 6A-6G are cross-sectional views each illustrating a process of a method for manufacturing a printed wiring board according to an embodiment of the present invention.
Figure 6B:
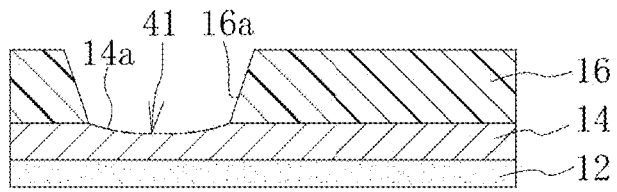

In the embodiment illustrated in FIGS. 6A-6G, first, as illustrated in FIG. 6A, an intermediate is prepared in which a conductor layer 14 and a solder resist layer 16 are formed on a base insulating layer 12. In the solder resist layer 16, a first opening (16a) exposing a portion of the conductor layer 14 as a first conductor pad (14a) is formed. Next, as illustrated in FIG. 6B, the first conductor pad (14a) exposed by the first opening (16a) is etched to form a recess 41.

Figure 6C:
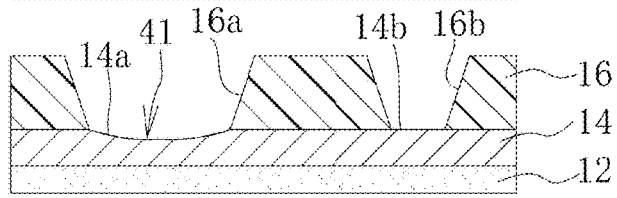

Next, as illustrated in FIG. 6C, in the solder resist layer 16, a second opening (16b) exposing another portion of the conductor layer 14 as a second conductor pad (14b) is formed, the another portion being different from the first conductor pad (14a).

Figure 6D:
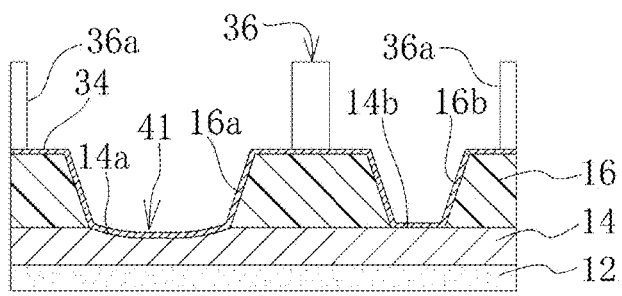
Figure 6E:
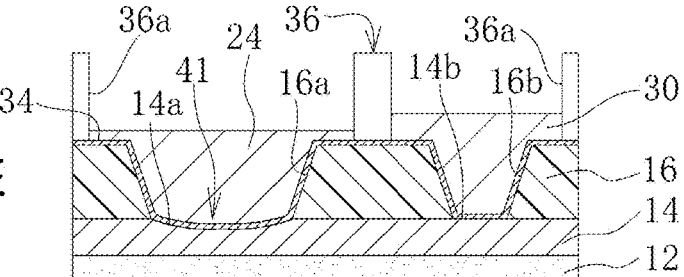

Next, as illustrated in FIG. 6D, a seed layer 34 is formed on a surface of the intermediate (on a surface of the solder resist layer 16 and side surfaces of the first and second openings (16a, 16b), and on the conductor pad (14a) (recess 41) and the conductor pad (14b)). Then, on the seed layer 34, a plating resist 36 of a predetermined pattern having openings (36a) at planed formation positions of the first and second bumps (20, 22) (FIG. 1) is formed. Next, as illustrated in FIG. 6E, a first base plating layer 24 and a second base plating layer 30 are respectively formed on portions of the seed layer 34 exposed from the plating resist 36. In this case, since the recess 41 exists in the portion where the first base plating layer 24 is formed, a height of the second base plating layer 30 is larger than a height of the first base plating layer 24.

Figure 6F:
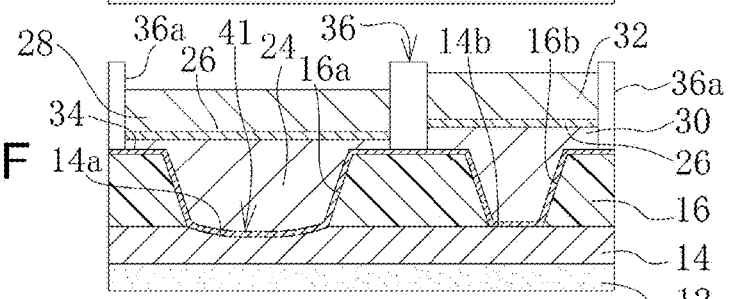
Figure 6G:
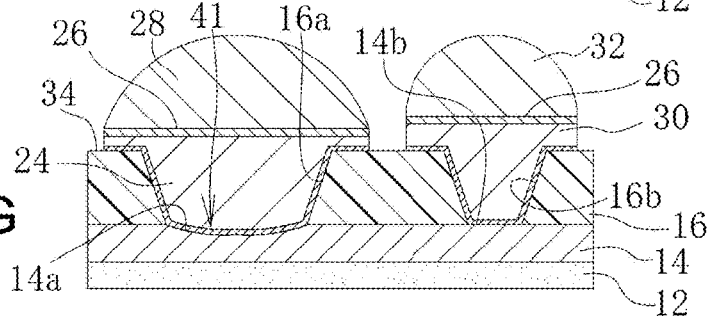

Next, as illustrated in FIG. 6F, an intermediate layer 26 is formed on the first and second base plating layers (24, 30). Then, first and second top plating layers (28, 32) are respectively formed on the first and second base plating layers (24, 30) via the intermediate layers 26. Next, as illustrated in FIG. 6G, the plating resist 36 is peeled off. Further, a portion of the seed layer 34 exposed by the removal of the plating resist 36 is removed by etching. After that, a reflow treatment is performed, and the first top plating layer 28 and the second top plating layer 32 are shaped into substantially hemispherical shapes.

Figure 7A:
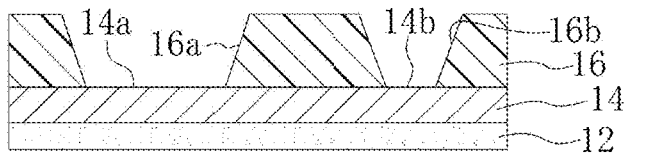
FIGS. 7A-7H are cross-sectional views each illustrating a process of a method for manufacturing a printed wiring board according to an embodiment of the present invention.

In the embodiment illustrated in FIGS. 7A-7H, first, as illustrated in FIG. 7A, an intermediate is prepared in which a conductor layer 14 and a solder resist layer 16 are formed on a base insulating layer 12. In the solder resist layer 16, a first opening (16a) exposing a portion of the conductor layer 14 as a first conductor pad (14a) and a second opening (16b) exposing another portion of the conductor layer 14 as a second conductor pad (14b) are formed.

Figure 7B:
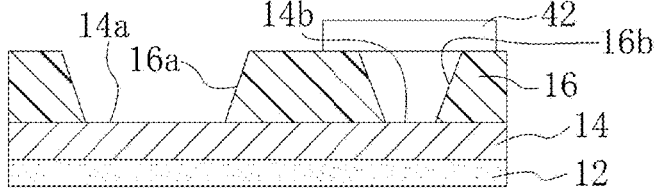
Figure 7C:
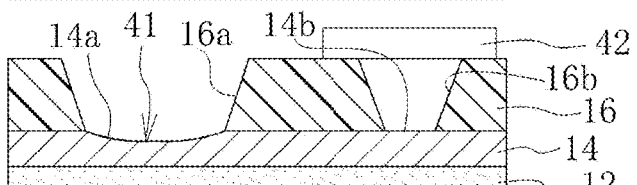
Figure 7D:
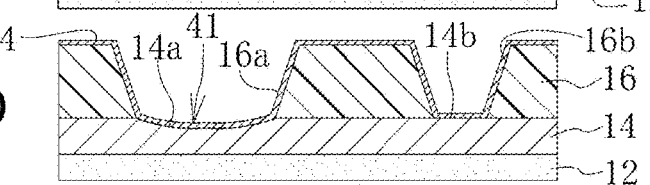

Next, as illustrated in FIG. 7B, the second opening (10b) is filled with a dry film resist layer 42 to protect the second opening (16b). Next, as illustrated in FIG. 7C, the first conductor pad (14a) exposed by the first opening (16a) is etched to form a recess 41. Next, as illustrated in FIG. 7D, the dry film resist layer 42 is removed, and a seed layer 34 is formed on a surface of the intermediate (on a surface of the solder resist layer 16 and side surfaces of the first and second openings (16a, 16b), and on the conductor pad (14a) (recess 41) and the conductor pad (14b)).

Figure 7E:
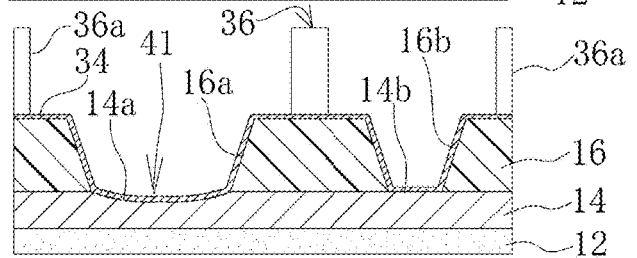
Figure 7F:
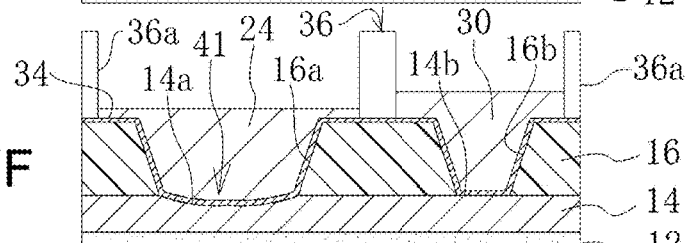

As illustrated in FIG. 7E, on the seed layer 34, a plating resist 36 of a predetermined pattern having openings (36a) at planed formation positions of the first and second bumps (20, 22) (FIG. 1) is formed. Next, as illustrated in FIG. 7F, a first base plating layer 24 and a second base plating layer 30 are respectively formed on portions of the seed layer 34 exposed from the plating resist 36. In this case, since the recess 41 exists in the portion where the first base plating layer 24 is formed, a height of the second base plating layer 30 is larger than a height of the first base plating layer 24.

Figure 7G:
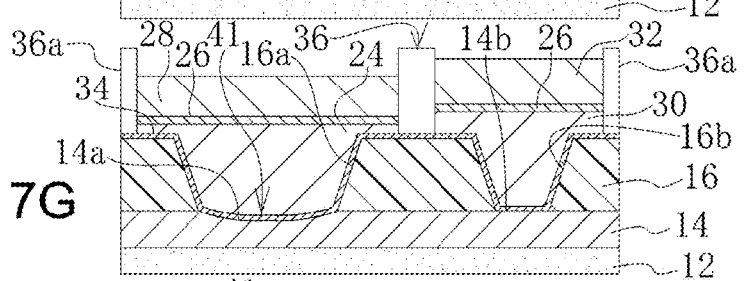
Figure 7H:
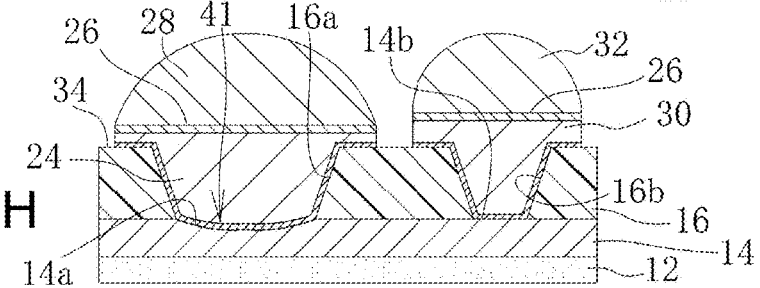

Next, as illustrated in FIG. 7G, an intermediate layer 26 is formed on the first and second base plating layers (24, 30). Then, first and second top plating layers (28, 32) are respectively formed on the first and second base plating layers (24, 30) via the intermediate layers 26. Next, as illustrated in FIG. 7H, the plating resist 36 is peeled off. Further, a portion of the seed layer 34 exposed by the removal of the plating resist 36 is removed by etching. After that, a reflow treatment is performed, and the first top plating layer 28 and the second top plating layer 32 are shaped into substantially hemispherical shapes.

Figure 8:
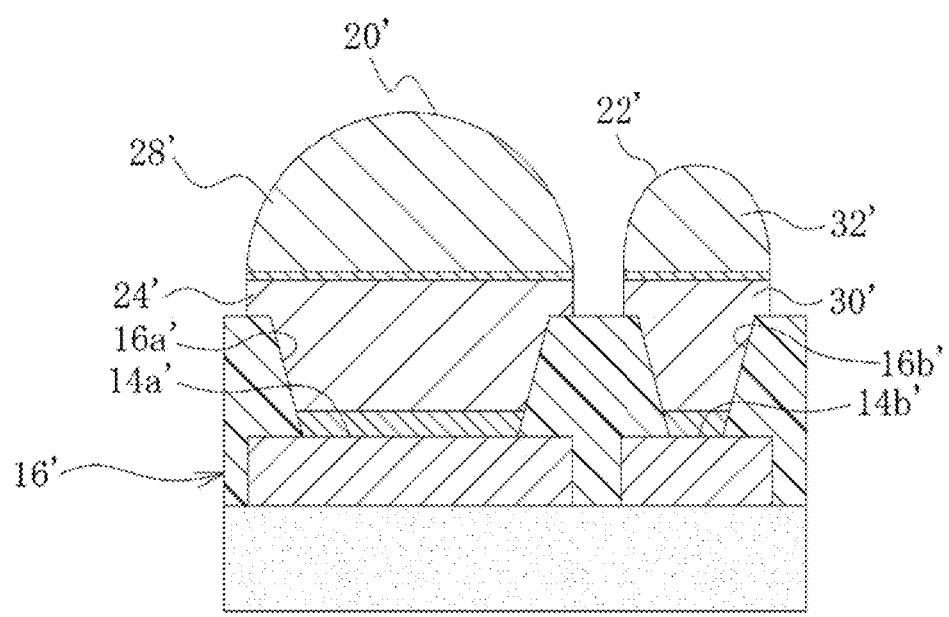
FIG. 8 is a cross-sectional view for describing a state in which bumps have different heights in a printed wiring board according to a conventional technology.

As illustrated in FIG. 8, when bumps (20', 22') of different sizes are respectively formed by forming base plating layers (24', 30') on conductor pads (14a', 14b') in openings (16a', 16b) of different sizes formed in a solder resist layer (16') and forming top plating layers (28', 32') on the base plating layers (24', 30'), it is thought that, after reflow of the top plating layers (28', 32'), heights of the bumps may not be the same.

A method for manufacturing a printed wiring board according to an embodiment of the present invention includes: forming a base insulating layer; forming a conductor layer on the base insulating layer; forming a solder resist layer on the base insulating layer and on the conductor layer; forming a first opening in the solder resist layer to expose a portion of the conductor layer as a first conductor pad; forming a second opening in the solder resist layer to expose another portion of the conductor layer as a second conductor pad, the second opening having a diameter smaller than that of the first opening; forming a first bump on the first conductor pad; and forming a second bump on the second conductor pad, the second bump having a diameter smaller than that of the first bump. The forming of the first bump includes: forming a first base plating layer in the first opening; forming a first top plating layer on the first base plating layer; and reflowing the first top plating layer. The forming of the second bump includes: forming a second base plating layer in the second opening; forming a second top plating layer on the second base plating layer, the second top plating layer having an upper surface that is above an uppermost position of an upper surface of the first top plating layer; and reflowing the second top plating layer.

A printed wiring board according to an embodiment of the present invention includes: a base insulating layer; a conductor layer formed on the base insulating layer; a solder resist layer that is formed on the base insulating layer and on the conductor layer, and that has a first opening exposing a portion of the conductor layer as a first conductor pad and a second opening exposing another portion of the conductor layer as a second conductor pad, the second opening having a diameter smaller than that of the first opening; a first bump formed on the first conductor pad; and a second bump formed on the second conductor pad, the second bump having a diameter smaller than that of the first bump. The first bump has a first base plating layer formed in the first opening, and a first top plating layer formed on the first base plating layer. The second bump has a second base plating layer formed in the second opening, and a second top plating layer formed on the second base plating layer. A lowermost position of the first bump is lower than a lowermost position of the second bump, and an uppermost position of the first bump is substantially the same as an uppermost position of the second bump.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming a base insulating layer;
   forming a conductor layer on the base insulating layer;
   forming a solder resist layer on the base insulating layer such that the solder resist layer covers the conductor layer;
   forming a first opening in the solder resist layer such that the first opening exposes a first conductor pad of the conductor layer;

forming a second opening in the solder resist layer such that the second opening exposes a second conductor pad and has a diameter smaller than a diameter of the first opening;

forming a first bump on the first conductor pad; and forming a second bump on the second conductor pad such that the second bump has a diameter smaller than a diameter of the first bump, wherein the forming of the first bump includes forming a first base plating layer in the first opening, forming a first top plating layer on the first base plating layer, and reflowing the first top plating layer, the forming of the second bump includes forming a second base plating layer in the second opening, forming a second top plating layer on the second base plating layer such that the second top plating layer has an upper surface that is higher than an uppermost position of an upper surface of the first top plating layer prior to reflow of the first and second top plating layers, and reflowing the second top plating layer such that that an uppermost position of the first top plating layer of the first bump is substantially the same as an uppermost position of the second top plating layer of the second bump after the reflow of the first and second top plating layers, and the forming of the first base plating layer and the forming of the second base plating layer comprise forming the first and second base plating layers such that the first and second base plating layers have thicknesses from a surface of the solder resist layer to upper outer peripheral portions of the first and second base plating layers in a same range, that the first base plating layer has a first recess having a depth of 20 µm or less in an upper central portion thereof and that the second base plating layer has a raised portion in an upper central portion thereof, and the forming of the first bump and the forming of the second bump include forming the first bump and the second bump such that a lowermost position of the first top plating layer of the first bump at a middle of the first top plating layer is lower than a lowermost position of the second top plating layer of the second bump at a middle of the second top plating layer.

2. The method for manufacturing a printed wiring board according to claim 1, wherein each of the first top plating layer and the second top plating layer is formed to have a thickness in a range of 5 µm to 45 µm.

3. The method for manufacturing a printed wiring board according to claim 1, wherein the first base plating layer is formed of a metal comprising copper as a main component, and the second base plating layer is formed of a metal comprising copper as a main component.

4. The method for manufacturing a printed wiring board according to claim 1, wherein the first top plating layer is formed of a metal comprising tin as a main component, and the second top plating layer is formed of a metal comprising tin as a main component.

5. The method for manufacturing a printed wiring board according to claim 1, further comprising:

forming an underlayer comprising a nickel layer, a palladium layer and a gold layer such that the underlayer is positioned between the first base plating layer and the first conductor pad and between the second base plating layer and the second conductor pad.

6. The method for manufacturing a printed wiring board according to claim 1, wherein the forming of the first bump includes forming an intermediate layer comprising nickel as a main component such that the intermediate layer is positioned between the first base plating layer and the first top plating layer, and the forming of the second bump includes forming an intermediate layer comprising nickel as a main component such that the intermediate layer is positioned between the second base plating layer and the second top plating layer.

7. The method for manufacturing a printed wiring board according to claim 6, wherein the first and second bumps are formed such that each of the intermediate layers in the first and second bumps is formed to have a thickness of 7 µm or less.

8. The method for manufacturing a printed wiring board according to claim 1, wherein each of the first and second base plating layers is formed to have a height exceeding a surface of the solder resist layer, and a thickness measured from the surface of the solder resist layer within a range of 3 µm to 20 µm.

9. The method for manufacturing a printed wiring board according to claim 1, wherein the first opening is formed to have an aspect ratio of 0.5 or less, and the second opening is formed to have an aspect ratio of 0.6 or more.

10. A printed wiring board, comprising:

a base insulating layer;

a conductor layer formed on the base insulating layer;

a solder resist layer formed on the base insulating layer and covering the conductor layer such that the solder resist layer has a first opening exposing a first conductor pad of the conductor layer and a second opening exposing a second conductor pad of the conductor layer and having a diameter smaller than a diameter of the first opening;

a first bump formed on the first conductor pad and comprising a first base plating layer formed in the first opening, and a first top plating layer formed on the first base plating layer; and a second bump formed on the second conductor pad and comprising a second base plating layer formed in the second opening, and a second top plating layer formed on the second base plating layer such that the second bump has a diameter smaller than a diameter of the first bump, wherein the first bump and the second bump are formed such that the first and second base plating layers have thicknesses from a surface of the solder resist layer to upper outer peripheral portions of the first and second base plating layers in a same range, that a lowermost position of the first top plating layer of the first bump at a middle of the first top plating layer is lower than a lowermost position of the second top plating layer of the second bump at a middle of the second top plating layer and that an uppermost position of the first top plating layer of the first bump is substantially the same as an uppermost position of the second top plating layer of the second bump, the first base plating layer has a first recess having a depth of 20 µm or less in an upper central portion thereof, and the second base plating layer has a raised portion in an upper central portion thereof.

11. The printed wiring board according to claim 10, wherein each of the first top plating layer and the second top plating layer has a thickness in a range of 5 µm to 45 µm.

12. The printed wiring board according to claim 10, wherein the first base plating layer is formed of a metal comprising copper as a main component, and the second base plating layer is formed of a metal comprising copper as a main component.

13. The printed wiring board according to claim 10, wherein the first top plating layer is formed of a metal comprising tin as a main component, and the second top plating layer is formed of a metal comprising tin as a main component.

14. The printed wiring board according to claim 10, further comprising:
an underlayer comprising a nickel layer, a palladium layer and a gold layer such that the underlayer is formed between the first base plating layer and the first conductor pad and between the second base plating layer and the second conductor pad.

15. The printed wiring board according to claim 10, wherein the first bump includes an intermediate layer comprising nickel as a main component and formed between the first base plating layer and the first top plating layer, and the second bump includes an intermediate layer comprising nickel as a main component and formed between the second base plating layer and the second top plating layer.

16. The printed wiring board according to claim 15, wherein the first and second bumps are formed such that each of the intermediate layers in the first and second bumps has a thickness of 7 µm or less.

17. The printed wiring board according to claim 10, wherein each of the first and second base plating layers is formed to have a height exceeding a surface of the solder resist layer, and a thickness measured from the surface of the solder resist layer within a range of 3 µm to 20 µm.

18. The printed wiring board according to claim 10, wherein the solder resist layer is formed such that the first opening has an aspect ratio of 0.5 or less and that the second opening has an aspect ratio of 0.6 or more.

19. The printed wiring board according to claim 12, wherein the first top plating layer is formed of a metal comprising tin as a main component, and the second top plating layer is formed of a metal comprising tin as a main component.

20. The printed wiring board according to claim 15, wherein the first base plating layer is formed of a metal comprising copper as a main component, the second base plating layer is formed of a metal comprising copper as a main component, the first top plating layer is formed of a metal comprising tin as a main component, and the second top plating layer is formed of a metal comprising tin as a main component.

* * * * *